United States Patent
Kataoka et al.

(10) Patent No.: US 10,832,888 B2
(45) Date of Patent: Nov. 10, 2020

(54) ION MILLING APPARATUS AND SAMPLE HOLDER

(71) Applicant: JEOL Ltd., Tokyo (JP)

(72) Inventors: Shogo Kataoka, Tokyo (JP); Toru Kagawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/299,632

(22) Filed: Mar. 12, 2019

(65) Prior Publication Data
US 2019/0287755 A1 Sep. 19, 2019

(30) Foreign Application Priority Data
Mar. 13, 2018 (JP) .................................. 2018-045981

(51) Int. Cl.
*H01J 37/20* (2006.01)
*H01J 37/26* (2006.01)
*H01J 37/305* (2006.01)

(52) U.S. Cl.
CPC ............ *H01J 37/20* (2013.01); *H01J 37/261* (2013.01); *H01J 37/3053* (2013.01); *H01J 2237/0262* (2013.01)

(58) Field of Classification Search
CPC ........ H01J 37/20; H01J 37/026; H01J 37/261; H01J 2237/2007; H01J 2237/204; H01J 2237/026; H01J 2237/0262; H01J 2237/31745
See application file for complete search history.

(56) References Cited

U.S. PATENT DOCUMENTS

| | | | | |
|---|---|---|---|---|
| 5,907,157 A * | 5/1999 | Yoshioka | ................. | G01N 1/32 250/492.2 |
| 9,507,139 B2 * | 11/2016 | Negishi | ................. | G02B 21/26 |
| 2005/0118065 A1 * | 6/2005 | Hasegawa | ............. | H01J 37/305 422/502 |
| 2006/0169923 A1 * | 8/2006 | Yamashita | .............. | H01J 37/20 250/492.21 |
| 2007/0199738 A1 * | 8/2007 | Gabower | ................ | G06F 1/182 174/350 |
| 2008/0067443 A1 * | 3/2008 | Todoroki | ............... | G01N 1/286 250/492.21 |
| 2009/0323287 A1 * | 12/2009 | Patterson | .......... | H01L 21/67098 361/709 |
| 2011/0240881 A1 * | 10/2011 | Miyazaki | ................ | H01J 37/20 250/442.11 |

(Continued)

FOREIGN PATENT DOCUMENTS

JP         2013137995 A      7/2013

*Primary Examiner* — Wyatt A Stoffa
(74) *Attorney, Agent, or Firm* — The Webb Law Firm

(57) ABSTRACT

There is provided an ion milling apparatus and sample holder permitting one to observe a sample, which has been milled, with an electron microscope without transferring the sample to a different holding member. The ion milling apparatus has an ion source, a sample holder, and a sample stage. The sample holder includes: a holder body having a sample holding portion for holding the sample; and a cover member detachably mounted to the holder body and hermetically sealing the sample held on the sample holding portion. The holder body has a shield plate and a field-correcting plate for correcting electric fields around the sample held on the sample holding portion.

10 Claims, 13 Drawing Sheets

(56) References Cited

U.S. PATENT DOCUMENTS

| | | | | |
|---|---|---|---|---|
| 2012/0085938 A1* | 4/2012 | Coyle | .................. | H01J 37/20 |
| | | | | 250/492.3 |
| 2013/0134325 A1* | 5/2013 | Negishi | .................. | G01N 1/32 |
| | | | | 250/428 |
| 2013/0174301 A1* | 7/2013 | Robinson | ................ | H01J 37/20 |
| | | | | 850/33 |
| 2013/0240353 A1* | 9/2013 | Watanabe | ........... | H01J 37/3053 |
| | | | | 204/298.36 |
| 2015/0048247 A1* | 2/2015 | Kawanami | ............ | H01J 37/265 |
| | | | | 250/307 |
| 2016/0163508 A1* | 6/2016 | Iwaya | .................. | H01J 37/304 |
| | | | | 204/192.33 |
| 2018/0301318 A1* | 10/2018 | Iwaya | ................... | H01J 37/3053 |
| 2019/0122853 A1* | 4/2019 | Ikeuchi | .................. | H01J 37/20 |

* cited by examiner

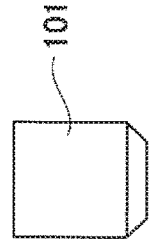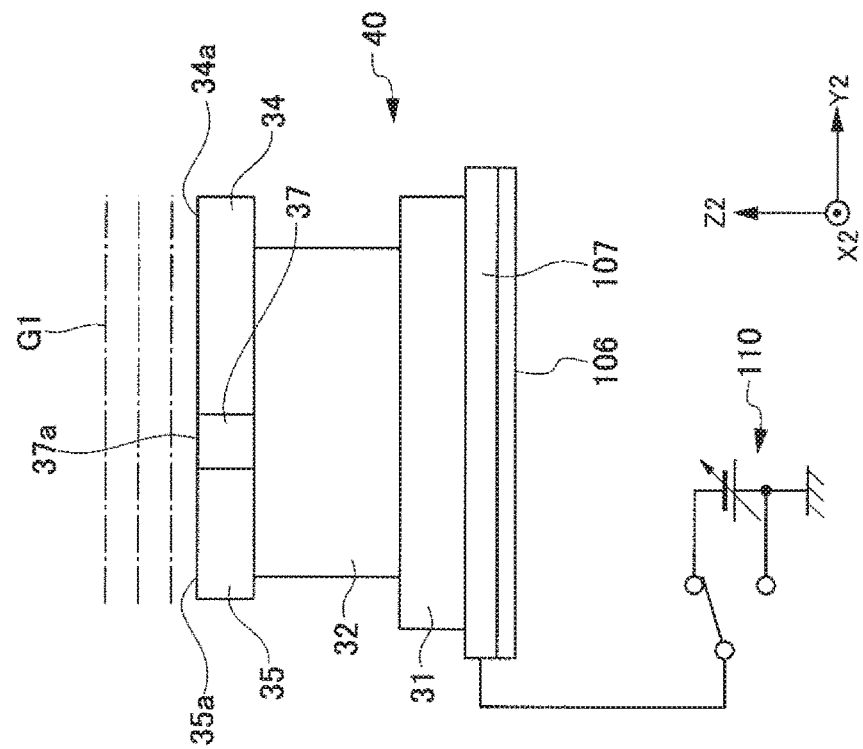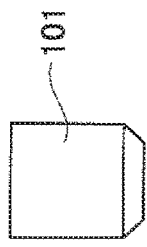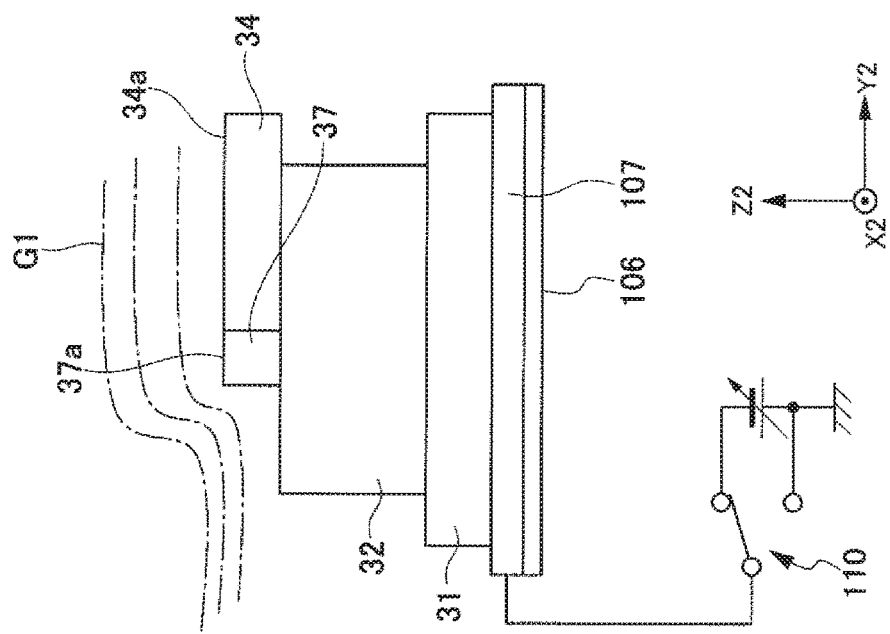

ION MILLING APPARATUS AND SAMPLE HOLDER

CROSS-REFERENCE TO RELATED APPLICATION

This application claims priority to Japanese Patent Application No. 2018-045981 filed Mar. 13, 2018, the disclosure of which is hereby incorporated by reference in its entirety.

BACKGROUND OF THE INVENTION

Field of the Invention

The present invention relates to an ion milling apparatus used for fabrication of a sample that is observed on a scanning electron microscope, a transmission electron microscope, or the like. The invention also relates to a sample holder for holding a sample.

Description of Related Art

Generally, a sample observed with an electron microscope such as a scanning electron microscope (SEM) or a transmission electron microscope (TEM) is etched by irradiating the sample with an ion beam using an ion milling apparatus such that the sample is milled into a shape adapted for observation.

Sometimes, members which readily react with atmospheric constituents such as oxygen and nitrogen may be used as samples. One technique of milling such a sample readily reactable with atmospheric constituents is disclosed, for example, in JP-A-2013-137995 and is equipped with a sample container that has a sample placement section on which the sample is placed, a base section providing support of the sample placement section, and a cover portion detachably mounted to the base section. The cover portion forms a sealed space in which the sample is encapsulated.

With the technique set forth in JP-A-2013-137995, however, when a sample held on a sample holder is observed with an electron microscope and a voltage is applied to the sample, electric fields around the sample are disturbed. This, in turn, distorts the electron beam emitted from the electron optical column of the electron microscope, giving rise to the undesirable situation where the sample cannot be observed precisely. As a result, with the technique set forth in JP-A-2013-137995, it is necessary to transfer the sample to a different holding member if the milling is complete. This creates the danger that the sample is exposed to the atmosphere. Also, the work is made quite cumbersome.

SUMMARY OF THE INVENTION

In view of the foregoing problems, it is an object of the present invention to provide an ion milling apparatus and sample holder permitting a fully milled sample to be observed using an electron microscope without the necessity of transferring the milled sample to a different holding member.

This object is achieved by an ion milling apparatus of the present invention, the ion milling apparatus comprising: an ion source for emitting an ion beam; a sample holder on which a sample is loaded; and a sample stage on which the sample holder is mounted.

The sample holder includes: a holder body having a sample holding portion for holding the sample; and a cover member detachably mounted to the holder body and hermetically sealing the sample held on the sample holding portion.

Furthermore, the holder body has a shield plate and a field-correcting plate. The shield plate provides a cover over a part of the sample held on the sample holding portion and shields the ion beam. The shield plate corrects electric fields around the sample held on the sample holding portion.

A sample holder according to the present invention comprises: a holder body having a sample holder portion for holding a sample; and a cover member detachably mounted to the holder body and hermetically sealing the sample held on the sample holding portion. The holder body has: a shield plate operative to cover a part of the sample held on the sample holding portion and to shield an ion beam emitted from an ion source; and a field-correcting plate for correcting electric fields around the sample held on the sample holding portion.

The ion milling apparatus and sample holder of the present invention makes it possible to observe the sample using an electron microscope when the milling of the sample is complete without the necessity of transferring the milled sample to a different holding member.

BRIEF DESCRIPTION OF THE DRAWINGS

FIGS. 11A and 11B are explanatory views showing the states of electric fields around a sample when a voltage is applied, in which FIG. 11A shows the state of electric fields on a conventional sample holder having no field-correcting plate and FIG. 11B shows the state of electric fields on the sample holder having a field-correcting plate in accordance with the first embodiment of the present invention.

DESCRIPTION OF THE INVENTION

Figure 1:
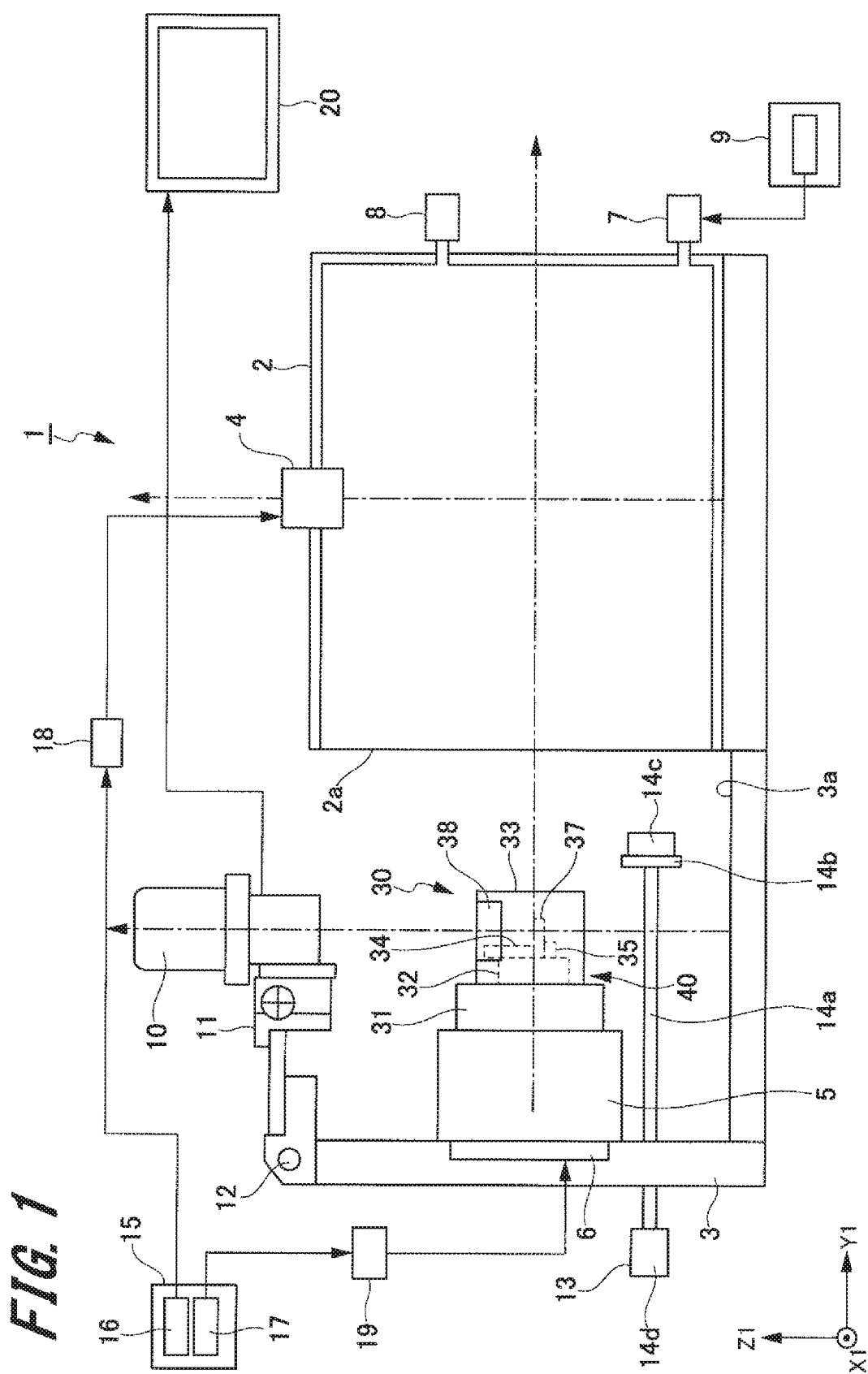
FIG. 1 is a schematic representation of an ion milling apparatus associated with a first embodiment of the present invention.

Illustrative examples of the ion milling apparatus and sample holder of the present invention are hereinafter described by referring to FIGS. 1-15. In the various figures, identical members are indicated by identical reference numerals.

1. First Embodiment 1-1. Configuration of Ion Milling Apparatus

An ion milling apparatus associated with a first embodiment of the present invention is first described by referring to FIG. 1, which is a schematic representation of this ion milling apparatus.

The instrument shown in FIG. 1 is an ion milling apparatus, 1, for preparing a sample, 37, observed under an electron microscope such as a scanning electron microscope (SEM), a transmission electron microscope (TEM), or the like. The ion milling apparatus 1 irradiates the sample 37 with an ion beam to etch the sample into a shape adapted for observation of the sample with SEM or TEM.

As shown in FIG. 1, the ion milling apparatus 1 includes a vacuum chamber 2, a sample stage pull-out mechanism 3, an ion source 4, a sample stage 5, a rotational mechanism 6, an exhaust section 7, an inert gas supply section 8, a vacuum pump driver 9, a positioning camera 10, and a controller 15. In addition, the ion milling apparatus 1 includes a voltage power supply 18, a rotational mechanism driver 19, and a display device 20.

The vacuum chamber 2 is shaped like a hollow container and has one surface provided with an opening 2a. The exhaust section 7 is coupled to the vacuum chamber 2 and driven by the vacuum pump driver 9. The air in the interior space of the vacuum chamber 2 is exhausted by the operation of the exhaust section 7.

The ion source 4 is mounted over the vacuum chamber 2. For example, a gas ion gun that emits an ion beam L1 of argon ions by ionizing argon gas by electric discharge is used as the ion source 4, which emits the ion beam L1 towards the interior space of the vacuum chamber 2 (see FIG. 8).

It is herein assumed that directions orthogonal to the optical axis of the ion beam L1 are a first direction X1 and a second direction Y1, respectively. Furthermore, it is assumed that the sample 37 held on the sample holder, 30, protrudes from a shield plate 34 in the second direction Y1 and that a direction orthogonal to the second direction Y1 is the first direction X1. In addition, it is assumed that the direction orthogonal to the first direction X1 and to the second direction Y1 and parallel to the optical axis of the ion beam L1 is a third direction Z1.

The voltage power supply 18 is connected with the ion source 4 and applies a voltage to the ion source 4. The voltage power supply 18 is controlled by an ion source control section 16 incorporated in the controller 15.

The controller 15 has a rotational mechanism control section 17 with which the rotational mechanism driver 19 is connected. The rotational mechanism control section 17 controls the operation of the rotational mechanism 6 by controlling the rotational mechanism driver 19.

The inert gas supply section 8 is mounted on the wall surface of the vacuum chamber 2 at a position opposite to the opening 2a and serves to supply an inert gas into the interior space of the vacuum chamber 2.

The sample stage pull-out mechanism 3 is movably secured to the vacuum chamber 2 via a connecting member 3a. The sample stage pull-out mechanism 3 is supported so as to be movable in the second direction Y1 relative to the vacuum chamber 2. As the sample stage pull-out mechanism 3 approaches the vacuum chamber 2, the opening 2a of the vacuum chamber 2 is closed up. The sample stage pull-out mechanism 3 has the sample stage 5, the rotational mechanism 6, and a cover member attaching-detaching portion 13.

The sample stage 5 is rotatably supported to the rotational mechanism 6. The rotational mechanism 6 is driven to tilt by the rotational mechanism driver 19. The sample stage 5 is accommodated in the interior space of the vacuum chamber 2. The sample holder 30 holding the sample 37 thereon is detachably mounted on the sample stage 5. The structure of the sample holder 30 will be described in detail later.

The rotational mechanism 6 has a rotating shaft to which the sample stage 5 is mounted. The center of rotation of the rotating shaft of the rotational mechanism 6 is disposed parallel to the second direction Y1 and extends orthogonal to the optical axis of the ion beam L1 and to the first direction X1.

The cover member attaching-detaching portion 13 has a shaft portion 14a, a bent portion 14b, a connective portion 14c, and a grip portion 14d. The shaft portion 14a is supported to the cover member attaching-detaching portion 13 so as to be rotatable and movable in the second direction Y1. The shaft portion 14a extends through the sample stage pull-out mechanism 3 in the second direction Y1. One end portion of the shaft portion 14a is located on one side of the sample stage pull-out mechanism 3 as viewed in the second direction Y1, while the other end portion of the shaft portion 14a is positioned on the other side of the sample stage pull-out mechanism 3 as viewed in the second direction Y1.

The bent portion 14b is continuous with the one end portion of the shaft portion 14a and bent substantially perpendicularly from the shaft portion 14a. The connective portion 14c is mounted to the bent portion 14b and detachably connected to a cover member 33 (described later) of the sample holder 30.

The grip portion 14d is formed on the other end portion of the shaft portion 14a. The grip portion 14d is gripped by a user to manipulate the cover member attaching-detaching portion 13.

The positioning camera 10 is mounted to the top end portion of the sample stage pull-out mechanism 3 via a camera rotating mechanism 12. The positioning camera 10 is rotatably supported by the camera rotating mechanism 12 to the top of the sample stage pull-out mechanism 3. As the camera rotating mechanism 12 rotates, the positioning camera 10 is brought into opposition, in the third direction Z1, to the sample holder 30 mounted to the sample stage 5.

The positioning camera 10 shoots both the sample 37 held on the sample holder 30 and the shield plate 34 and is connected to the display device 20. Images taken by the positioning camera 10 are displayed on the display device 20. Consequently, a user can visually check the amount of protrusion of the sample 37 from the shield plate 34. The camera rotating mechanism 12 is equipped with a camera position adjusting mechanism 11 for adjusting the position of the positioning camera 10.

1-2. Configuration of Sample Holder

Figure 2:
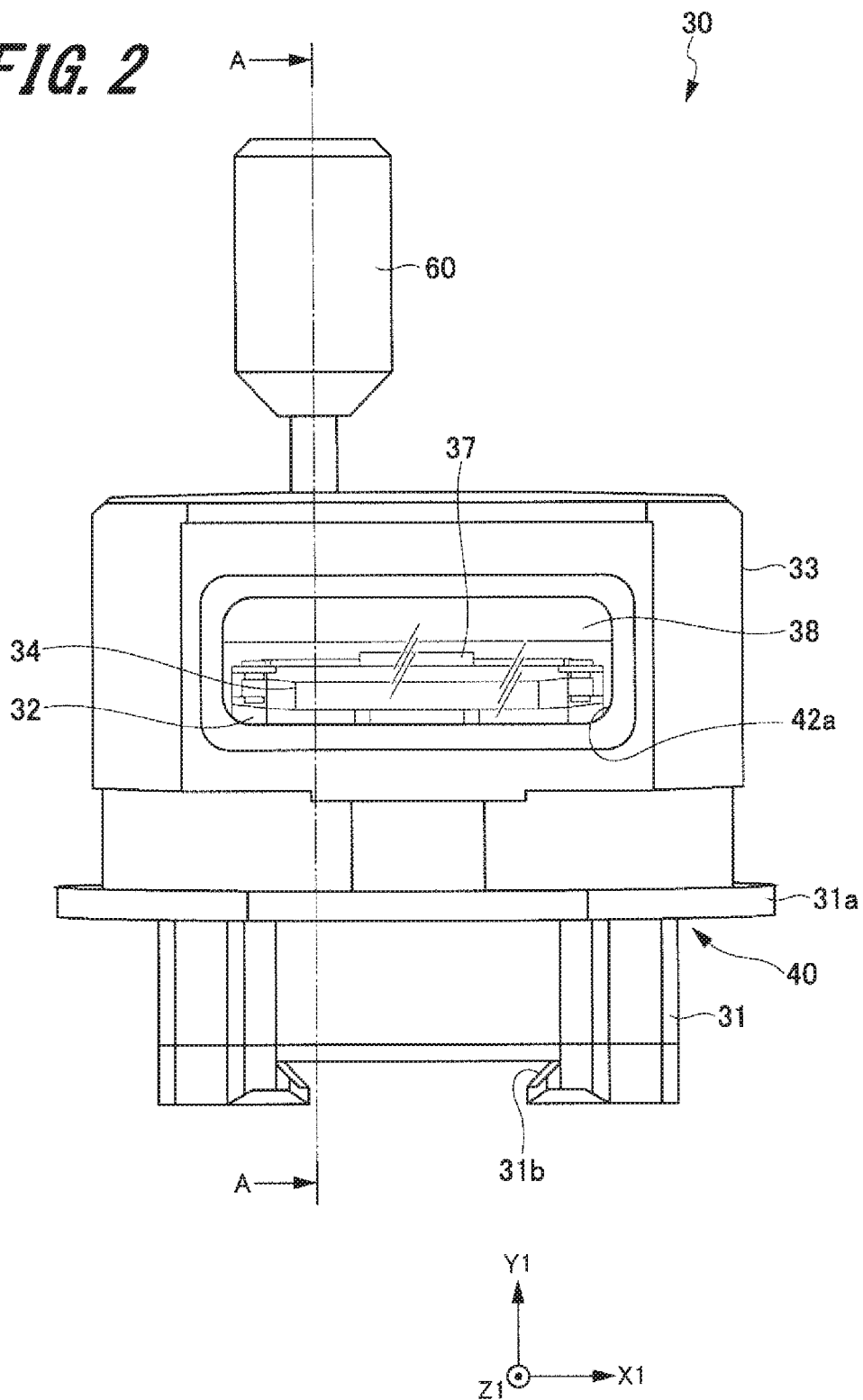
FIG. 2 is a front elevation of the sample holder shown in FIG. 1.
Figure 3:
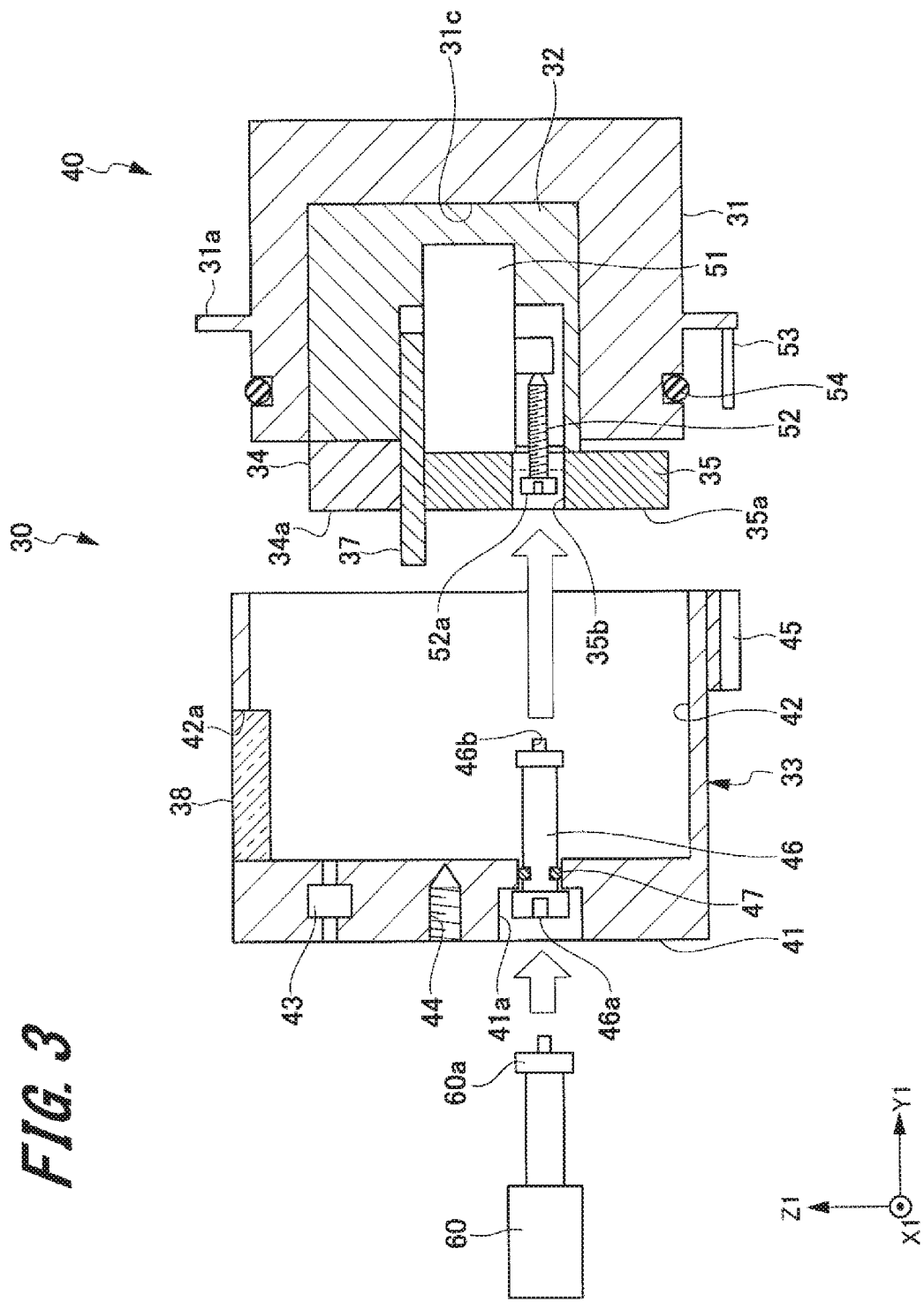
FIG. 3 is an exploded cross-sectional view of the sample holder of FIG. 2, as taken along line A-A of FIG. 2.

The configuration of the sample holder 30 is next described by referring to FIGS. 2-5. FIG. 2 is a front elevation of the sample holder 30. FIG. 3 is an exploded cross-sectional view of the sample holder 30, as taken along line A-A of FIG. 2. As shown in FIGS. 2 and 3, the sample holder 30 has a holder body 40 and the above-described cover member 33. The holder body 40 has a base portion 31, a sample holding portion 32, a shield plate 34, a field-correcting plate 35, and a milling position adjusting mechanism 51.

Base Portion

The base portion 31 is shaped substantially cylindrically. The base portion 31 has one end portion as viewed in the second direction Y1, and an attaching portion 31c is formed on this end portion (hereinafter may also be referred to as the second-direction one end portion). The attaching portion 31c is concaved from one surface of the second-direction one end portion of the base portion 31 toward the other end as viewed in the second direction Y1. The sample holding portion 32 is mounted to this attaching portion 31c.

As shown in FIG. 2, a holder side mounting portion 31b is formed on the other end portion of the base portion 31 as viewed in the second direction Y1. The holder side mounting portion 31b is detachably mounted to the sample stage 5. Also, the holder side mounting portion 31b can be detachably mounted to a sample stage 107 (see FIG. 9) of the electron microscope 100 being one example of mounting portion and to a holder stand 207 (see FIG. 12) of an optical microscope 200, as well as to the sample stage 5 of the ion milling apparatus 1.

A flange portion 31a is formed on the outer peripheral surface of the base portion 31. The flange portion 31a is formed peripherally continuously at the outer peripheral surface of the base portion 31. The flange portion 31a protrudes nearly vertically from the outer peripheral surface of the base portion 31.

A guide pin 53 is formed on the flange portion 31a and protrudes from the flange portion 31a toward the second-direction one end portion of the base portion 31. An O-ring 54 is mounted on the outer peripheral surface of the base portion 31 and attached closer to the second-direction one end portion than the flange portion 31a at the outer peripheral surface of the base portion 31. The cover member 33 is mounted to the second-direction one end portion of the base portion 31.

Sample Holding Portion

Figure 4:
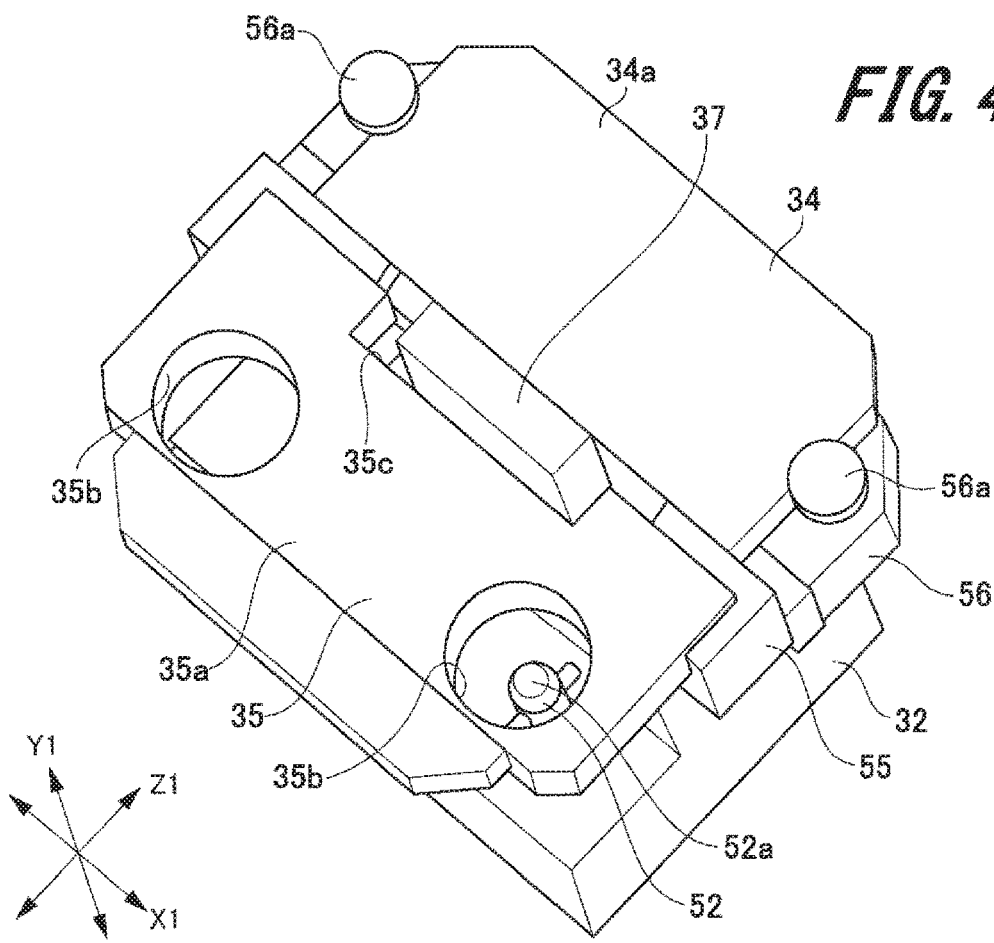
FIG. 4 is a perspective view of a sample holding portion of the sample holder of FIGS. 2 and 3.

FIG. 4 is a perspective view of the sample holding portion 32. As shown in FIGS. 3 and 4, one end portion of the sample holding portion 32 that extends in the second direction Y1 holds the sample 37. As shown in FIG. 4, a correcting plate securing portion 55 and a shield plate securing portion 56 are mounted on the portion of the sample holding portion 32 exposed from the attaching portion 31c, i.e., one end portion as viewed in the second direction Y1. The shield plate 34 is secured to the shield plate securing portion 56 by means of fixing pins 56a. The field-correcting plate 35 is secured to the correcting plate securing portion 55.

Milling Position Adjusting Mechanism

The milling position adjusting mechanism 51 is supported to the sample holding portion 32 so as to be movable in the second direction Y1. This milling position adjusting mechanism 51 permits the sample 37 held on the sample holding portion 32 to be moved in the second direction Y1.

The milling position adjusting mechanism 51 has a milling position adjusting pin 52 disposed in the second direction Y1. As the milling position adjusting pin 52 rotates, the milling position adjusting mechanism 51 moves in the second direction Y1. That is, the milling position adjusting mechanism 51 is manipulated by the milling position adjusting pin 52. The sample holding portion 32 moves together with the milling position adjusting mechanism 51 in the second direction Y1. In consequence, the milling position of the sample 37, i.e., the amount of protrusion from the shield plate 34, is adjusted.

A body side connecting portion 52a is mounted on one end portion of the milling position adjusting pin 52 as viewed in the second direction Y1. The body side connecting portion 52a protrudes from the base portion 31 and sample holding portion 32 toward the one end side as viewed in the second direction Y1. A second cover side connecting portion 46b (described later) is detachably connected to the body side connecting portion 52a.

Shield Plate

The shield plate 34 is shaped like a flat plate and secured to the shield plate securing portion 56. The shield plate 34 is located at a more positive position than the sample 37 as viewed along the third direction Z1, i.e., on the upstream side as viewed along the optical axis of the ion beam L1. One surface 34a of the shield plate 34 faces toward the one end side as viewed in the second direction Y1. The shield plate 34 is made of a material exhibiting higher resistance to the ion beam L1 than the sample 37. The shield plate 34 shields the ion beam L1 emitted from the ion source 4.

The shield plate 34 covers a part of the sample 37 held on the sample holding portion 32. The part of the sample 37 covered by the shield plate 34 is not etched by the ion beam L1 but remains unetched. The region of the sample 37 protruding from the shield plate 34 in the direction opposite to the second direction Y1 is etched away by the ion beam L1.

Field-Correcting Plate

The field-correcting plate 35 is shaped like a flat plate in the same manner as for the shield plate 34 and secured to the correcting plate securing portion 55. The field-correcting plate 35 is positioned at a more negative position than the shield plate 34 in the third direction Z1, i.e., on the downstream side of the shield plate 34 with respect to the optical axis of the ion beam L1. One surface 35a of the field-correcting plate 35 faces toward the one end side as viewed in the second direction Y1. The one surface 35a of the field-correcting plate 35 and the one surface 34a of the shield plate 34 are located at the same position when viewed along the second direction Y1. That is, the one surface 35a of the field-correcting plate 35 and the one surface 34a of the shield plate 34 are positioned in the same plane.

The field-correcting plate 35 is provided with two insertion holes 35b and a cutout portion 35c. One insertion hole 35b of the two insertion holes 35b faces and registers with the body side connecting portion 52a of the milling position adjusting pin 52.

The field-correcting plate 35 has one end portion as viewed in the third direction Z1. The cut-out portion 35c is formed in this end portion of the field-correcting plate 35 midway of the extent of the field-correcting plate 35 in the first direction X1. The cut-out portion 35c is formed by cutting out a length of the third-direction one end portion of the field-correcting plate 35 in the direction opposite to the third direction Z1 such that the length is equal to the length of the sample 37 taken in the third direction Z1. The sample 37 held on the sample holding portion 32 is placed in this cut-out portion 35c. Therefore, the shield plate 34 is positioned on one side of the sample 37 as viewed along the third direction Z1. The field-correcting plate 35 is disposed on the other side of the sample 37 as viewed along the third direction Z1 and on both sides of the sample 37 as viewed along the first direction X1.

The base portion 31, sample holding portion 32, shield plate 34, field-correcting plate 35, and milling position adjusting mechanism 51 together constituting the holder body 40 are made of a nonmagnetic material.

Cover Member

The cover member 33 is next described. As shown in FIGS. 2 and 3, the cover member 33 is detachably mounted to one end portion of the base portion 31 as viewed in the second direction Y1. The cover member 33 covers a part of the holder body 40 which includes the sample 37 held on the sample holding portion 32, shield plate 34, and field-correcting plate 35. The cover member 33 is shaped substantially cylindrically and has closed-off one end portion as viewed in the second direction Y1. The other end portion of the cover member 33 as viewed in the second direction Y1 is open. The cover member 33 has a main surface portion 41 and a side surface portion 42.

The main surface portion 41 is shaped like a disk. An exhaust valve 43 is mounted in the main surface portion 41 which in turn is provided with a connection hole 44. When the exhaust valve 43 is not open, the inside covered by the cover member 33 is closed off.

The connection hole 44 is formed around the radial center of the main surface portion 41. An internal thread is formed in the inner wall surface of the connection hole 44. The cover member attaching-detaching portion 13 has the connective portion 14c (see FIG. 1) which is threaded into the connection hole 44. Consequently, the cover member 33 is coupled to the cover member attaching-detaching portion 13.

A cover side connecting pin 46 is mounted to the main surface portion 41 and rotatably inserted into a mounting hole 41a formed in the main surface portion 41. The cover side connecting pin 46 extends through the main surface portion 41 in the second direction Y1. An O-ring 47 is mounted on the outer peripheral surface of the cover side connecting pin 46 and in intimate contact with the inner wall of the mounting hole 41a.

The cover side connecting pin 46 has one end portion as viewed in the second direction Y1, the one end portion being disposed in the mounting hole 41a of the main surface portion 41. The other end portion of the connecting pin 46 as viewed in the second direction Y1 protrudes in the second direction Y1 from the mounting hole 41a of the main surface portion 41 away from the one end portion.

A first cover side connecting portion 46a is formed in the one end portion of the cover side connecting pin 46. The second cover side connecting portion 46b is formed on the other end portion of the cover side connecting pin 46. The first cover side connecting portion 46a is detachably connected to a tool side connecting portion 60a of an adjusting tool 60.

Figure 5:
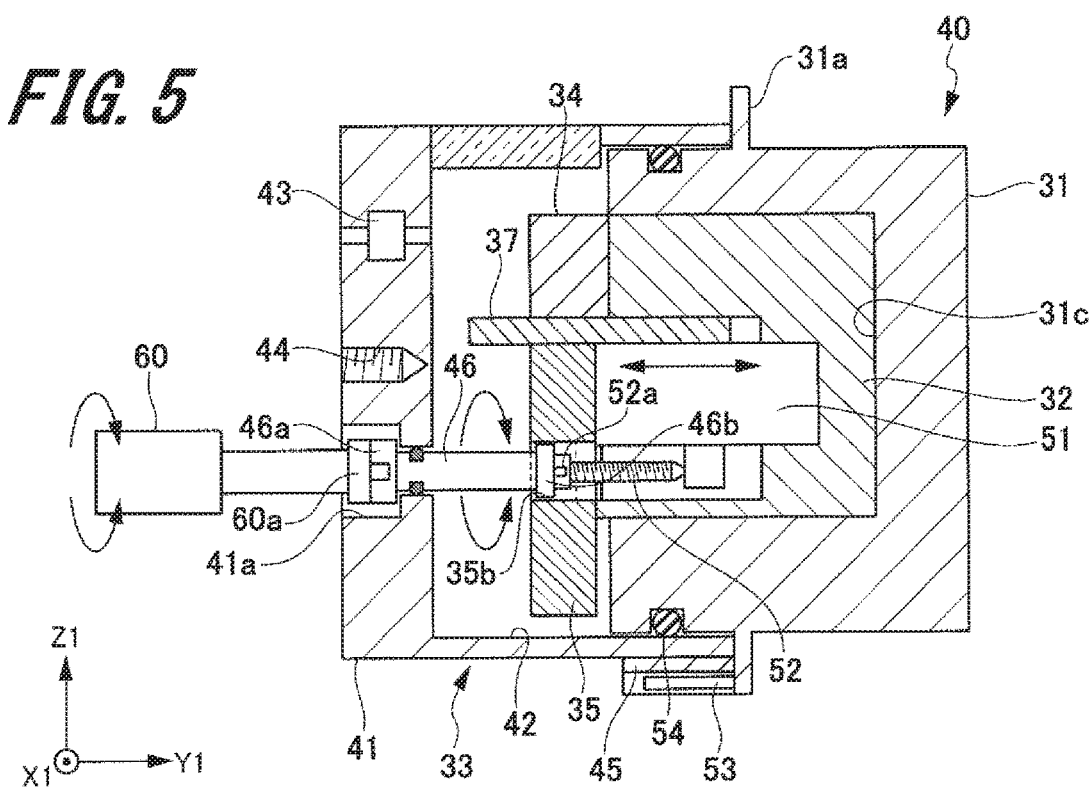
FIG. 5 is a cross-sectional view taken along line A-A of FIG. 2.

FIG. 5 is a cross-sectional view showing the state in which the cover member 33 has been mounted on the base portion 31. As shown, when the cover member 33 is mounted on the base portion 31, the second cover side connecting portion 46b of the cover side connecting pin 46 is inserted into the aforementioned one insertion hole 35b of the field-correcting plate 35. The second cover side connecting portion 46b is coupled to the body side connecting portion 52a of the milling position adjusting pin 52. Therefore, the milling position adjusting pin 52 is coupled to the adjusting tool 60 via the cover side connecting pin 46. If the user rotates the adjusting tool 60, the milling position adjusting pin 52 rotates together with the cover side connecting pin 46. Consequently, the sample 37 moves along with the milling position adjusting mechanism 51 in the second direction Y. Hence, the amount of protrusion of the sample 37 relative to the shield plate 34 can be adjusted.

As shown in FIG. 3, the side surface portion 42 protrudes from its radially outer fringes toward the other end portion of the main surface portion 41 as viewed in the second direction Y1. When the cover member 33 is mounted to the base portion 31 as shown in FIG. 5, the other end portion of the side surface portion 42 as viewed in the second direction Y1 abuts against the flange portion 31a of the base portion 31. The inner wall surface of the side surface portion 42 comes into intimate contact with the O-ring 54 mounted on the base portion 31. Consequently, the interior space of the cover member 33 is hermetically closed.

As shown in FIG. 3, the side surface portion 42 is provided with an opening window 42a. A glass pane made of a transparent or semi-transparent material is fitted in the opening window 42a, whereby an observation window 38 is formed. As shown in FIG. 2, the sample 37 sealed inside the cover member 33, the shield plate 34, and the field-correcting plate 35 can be visually checked from outside the cover member 33 through the observation window 38.

A guide member 45 is mounted on the side surface portion 42 and formed on the other end portion of the side surface portion 42 as viewed in the second direction Y1. As shown in FIG. 5, when the cover member 33 is mounted to the base portion 31, the guide pin 53 mounted on the base portion 31 is inserted into the guide member 45. The insertion of the guide pin 53 into the guide member 45 restricts the cover member 33 from rotating circumferentially of the base portion 31. The guide member 45 and the guide pin 53 cooperate to form a guide mechanism.

1-3. Example of Milling Operation Using Ion Milling Apparatus

Figure 6:
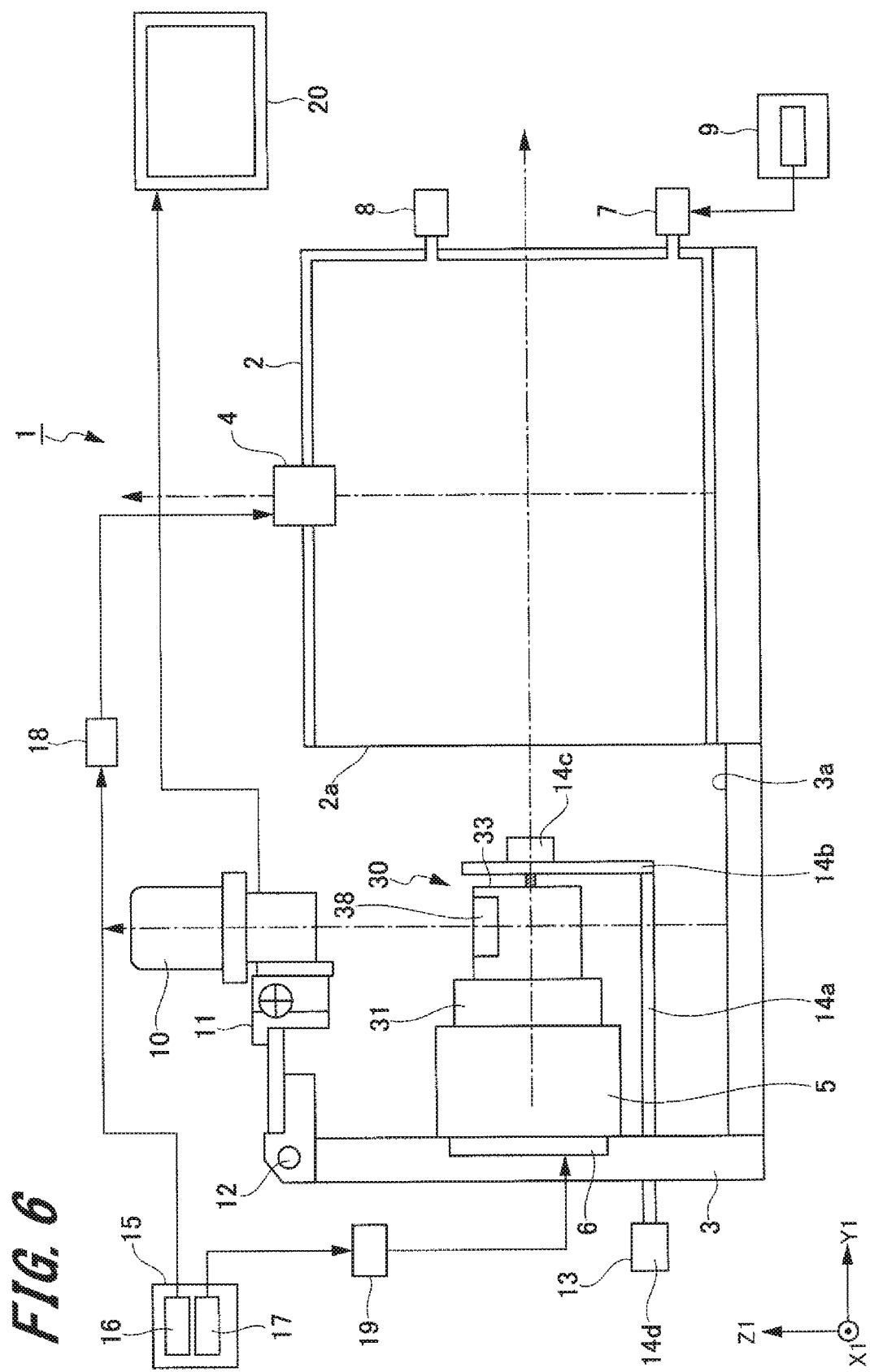
FIG. 6 is a schematic representation similar to FIG. 1, showing the state of the ion milling apparatus in which the sample holder and the cover member attaching-detaching portion have been connected together.
Figure 7:
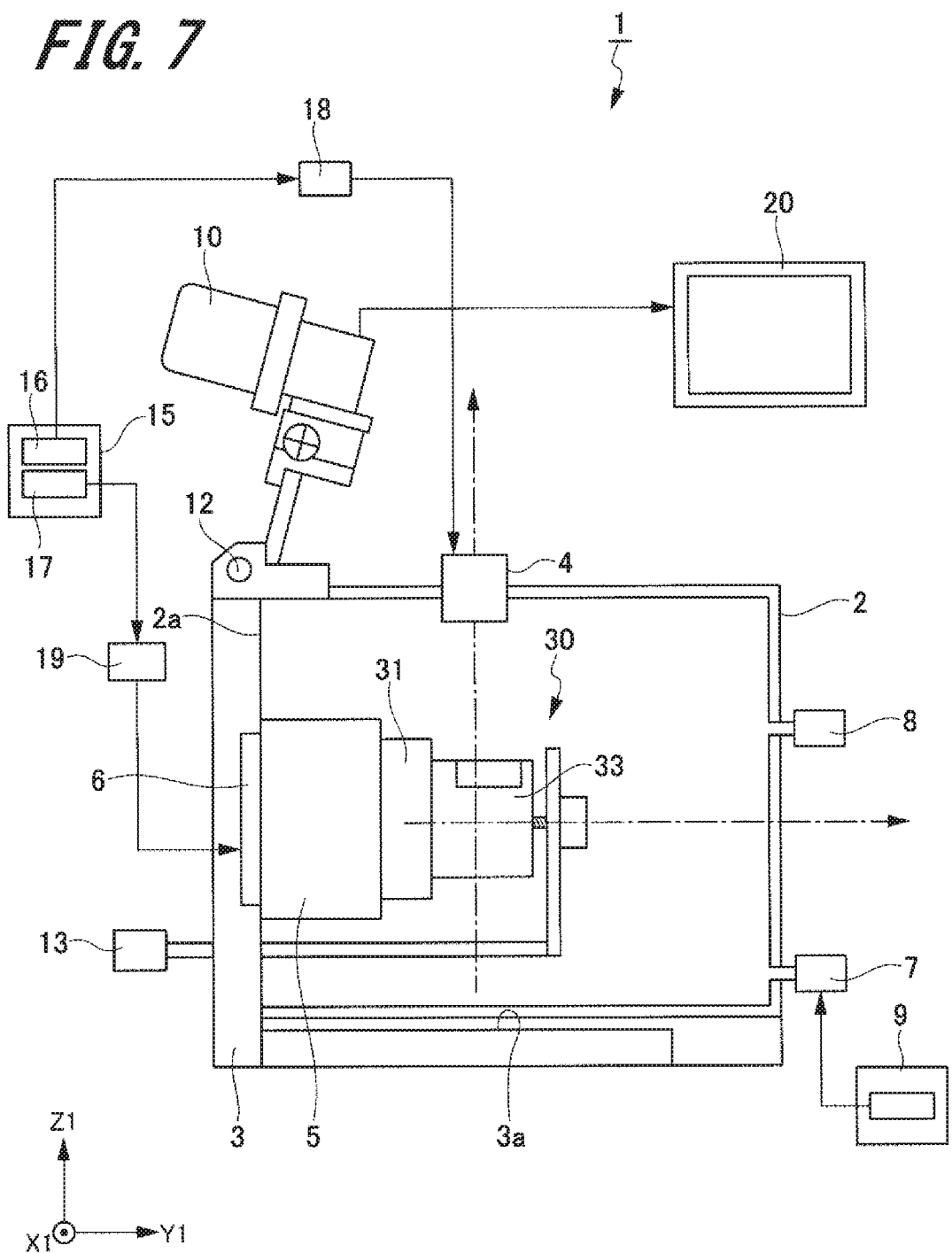
FIG. 7 is a schematic representation similar to FIG. 1, showing the state of the ion milling apparatus in which the sample holder has been moved into a vacuum chamber.
Figure 8:
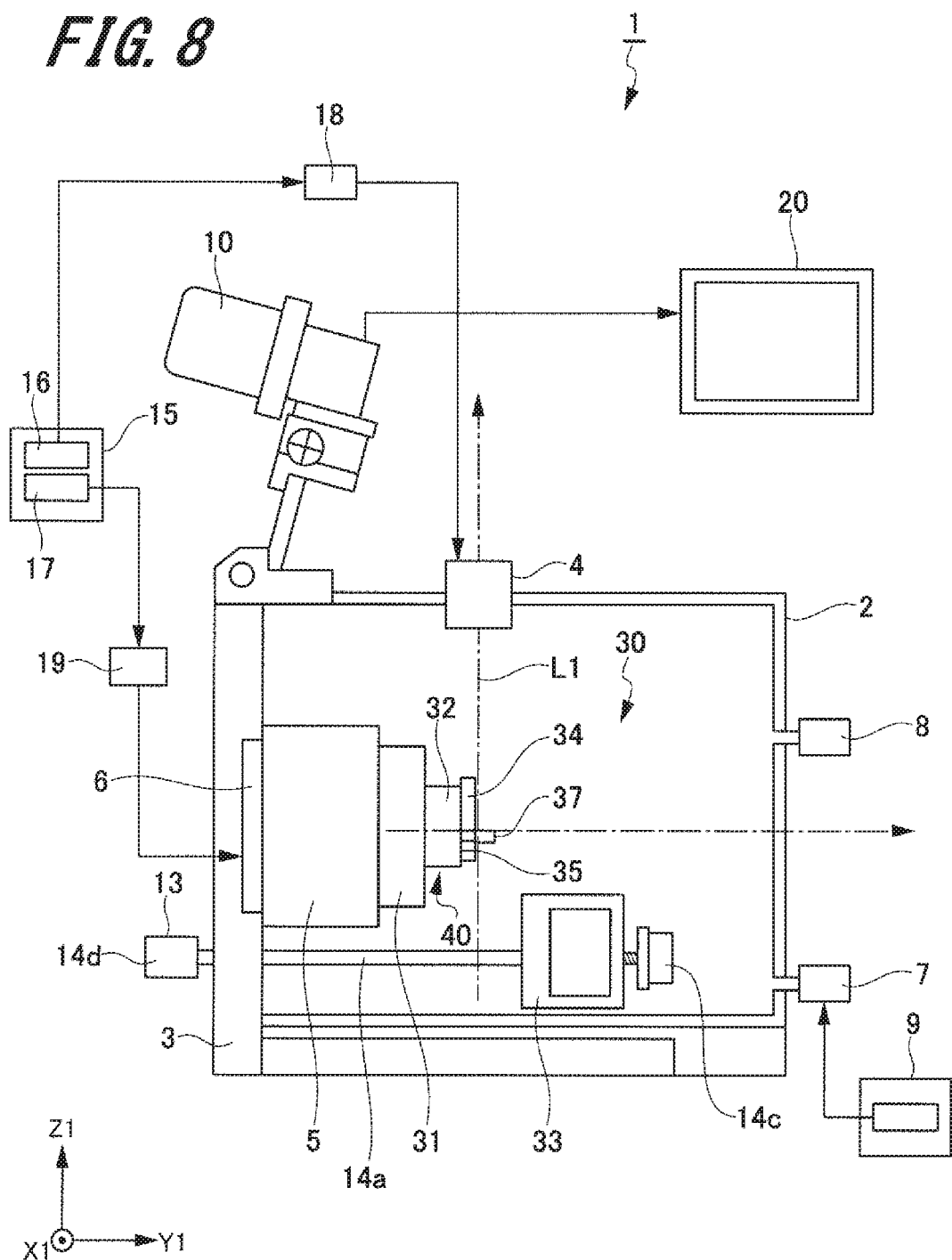
FIG. 8 is a schematic representation similar to FIG. 1, showing the manner in which a milling operation is being performed.

An example of milling operation performed using the ion milling apparatus 1 of the configuration described above is next described by referring to FIGS. 1-8. FIG. 6 shows the state in which the cover member 33 and the cover member attaching-detaching portion 13 have been connected together. FIG. 7 shows the state in which the sample holder 30 has been moved into the vacuum chamber 2. FIG. 8 shows the state in which a milling operation is being performed.

First, as shown in FIG. 4, the sample 37 that readily reacts with atmospheric constituents is loaded onto the sample holding portion 32 within a working chamber or glove box whose interior is in an inert gas ambient consisting of an inert gas such as argon. The shield plate 34 and the field-correcting plate 35 may be held on the sample holding portion 32 prior to or after the loading of the sample 37. Then, as shown in FIG. 3, the sample holding portion 32 on which the sample 37 is loaded is mounted on the attaching portion 31c of the base portion 31.

Then, as shown in FIG. 5, the cover member 33 is mounted on the holder body 40. During this mounting operation, the guide pin 53 and the guide member 45 serve to guide the cover member 30 to its mounting position relative to the holder body 40. Consequently, the base portion 31 and the cover member 33 can be easily placed in position. Furthermore, the cover side connecting pin 46 mounted on the cover member 33 can prevent contact with the sample 37, shield plate 34, and field-correcting plate 35.

As a result, as shown in FIGS. 2 and 5, the sample 37, shield plate 34, and field-correcting plate 35 are accommodated within the cover member 33. The O-ring 54 mounted on the base portion 31 makes intimate contact with the inner wall surface of the side surface portion 42 of the cover member 33. The O-ring 47 mounted on the cover side connecting pin 46 makes intimate contact with the inner wall surface of the mounting hole 41*a*. Therefore, the interior space of the cover member 33 is hermetically sealed, and the sample 37 is received within the space in an inert gas ambient.

By mounting the cover member 33 on the base portion 31, the second cover side connecting portion 46*b* of the cover side connecting pin 46 is coupled to the body side connecting portion 52*a* of the milling position adjusting pin 52. Then, the adjusting tool 60 is coupled to the cover side connecting pin 46. Then, the adjusting tool 60 is rotated to move the milling position adjusting mechanism 51 in the second direction Y1. Consequently, the amount of protrusion of the sample 37 in the second direction Y1 can be adjusted from outside of the cover member 33 while the sample 37 is hermetically sealed in the cover member 33.

Then, the sample holder 30 on which the sample 37 is loaded is taken out from the working room or glove box and mounted on the sample stage 5 mounted on the sample stage pull-out mechanism 3 as shown in FIG. 1. As noted previously, the cover member 33 is provided with the observation window 38 and so the amount of protrusion of the sample 37 can be adjusted using the camera 10 while the sample 37 is loaded on the sample stage 5.

Then, as shown in FIG. 6, the connective portion 14*c* of the cover member attaching-detaching portion 13 is connected to the cover member 33. That is, the connective portion 14*c* is threaded into the connection hole 44 (see FIG. 5) formed in the cover member 33. At this time, the cover member 33 is restricted from rotating circumferentially of the base portion 31 by the guide pin 53 and the guide member 45 (see FIG. 5). Consequently, when the connective portion 14*c* is screwed into the connection hole 44, rotation of the cover member 33 can be prevented.

Then, as shown in FIG. 7, the sample stage pull-out mechanism 3 is moved into the vacuum chamber 2, and the opening 2*a* of the vacuum chamber 2 is closed up by the sample stage pull-out mechanism 3. This brings the sample holder 30 into opposition to the ion source 4 in the third direction Z1. The exhaust section 7 is driven by the vacuum pump driver 9 to evacuate the air in the interior space of the vacuum chamber 2. As a result, a vacuum or substantially a vacuum is established in the interior space of the vacuum chamber 2.

Then, as shown in FIG. 8, the cover member attaching-detaching portion 13 is manipulated to take out the cover member 33 from the holder body 40. Because the interior space of the vacuum chamber 2 is a vacuum or substantially a vacuum, the sample 37 can be prevented from being exposed to the atmosphere.

Then, the ion beam L1 is emitted from the ion source 4 toward the sample 37. Consequently, the protrusive portion of the sample 37 projecting from the shield plate 34 toward the one end portion as viewed in the second direction Y1 is etched by the ion beam L1. One surface 34*a* of the shield plate 34 and one surface 35*a* (see FIGS. 3 and 5) of the field-correcting plate 35 are placed in the same plane. Therefore, one surface of the sample 37 on the side of the one end portion of the second direction Y1, i.e., the milled surface 37*a* (see FIG. 11B), is so milled that it is placed in the same plane as the one surface 34*a* of the shield plate 34 and the one surface 35*a* of the field-correcting plate 35.

When the milling of the sample 37 is complete, an inert gas such as argon is supplied from the inert gas supply section 8 into the vacuum chamber 2. The interior space of the vacuum chamber 2 is placed in an inert gas ambient. Then, the cover member 33 is mounted back to the base portion 31 using the cover member attaching-detaching portion 13. Consequently, the sample 37 is received in the cover member 33. That is, the sample 37 is hermetically sealed within the space in an ambient of inert gas.

There has been described an example in which an inert gas is supplied into the vacuum chamber 2 using the inert gas supply section 8. The present invention is not restricted to this example. For example, the cover member 33 may be mounted on the base portion 31 within a vacuum ambient without supplying any inert gas. In this case, the sample 37 would be hermetically sealed within the space in a vacuum ambient.

Then, as shown in FIG. 6, the sample stage pull-out mechanism 3 is moved to the other side as viewed in the second direction Y1, and the opening 2*a* of the vacuum chamber 2 is opened. Then, as shown in FIG. 1, the sample holder 30 is removed from the sample stage 5 in order to detach the cover member attaching-detaching portion 13 from the cover member 33. Since the sample 37 is hermetically sealed in the cover member 33, the sample is prevented from being exposed to the atmosphere. Thus, the operation to mill the sample 37 by the use of the ion milling apparatus 1 is completed.

1-4. Example of Operation for Observation of Sample

1-4-1. Example of Configuration of Electron Microscope

Figure 9:
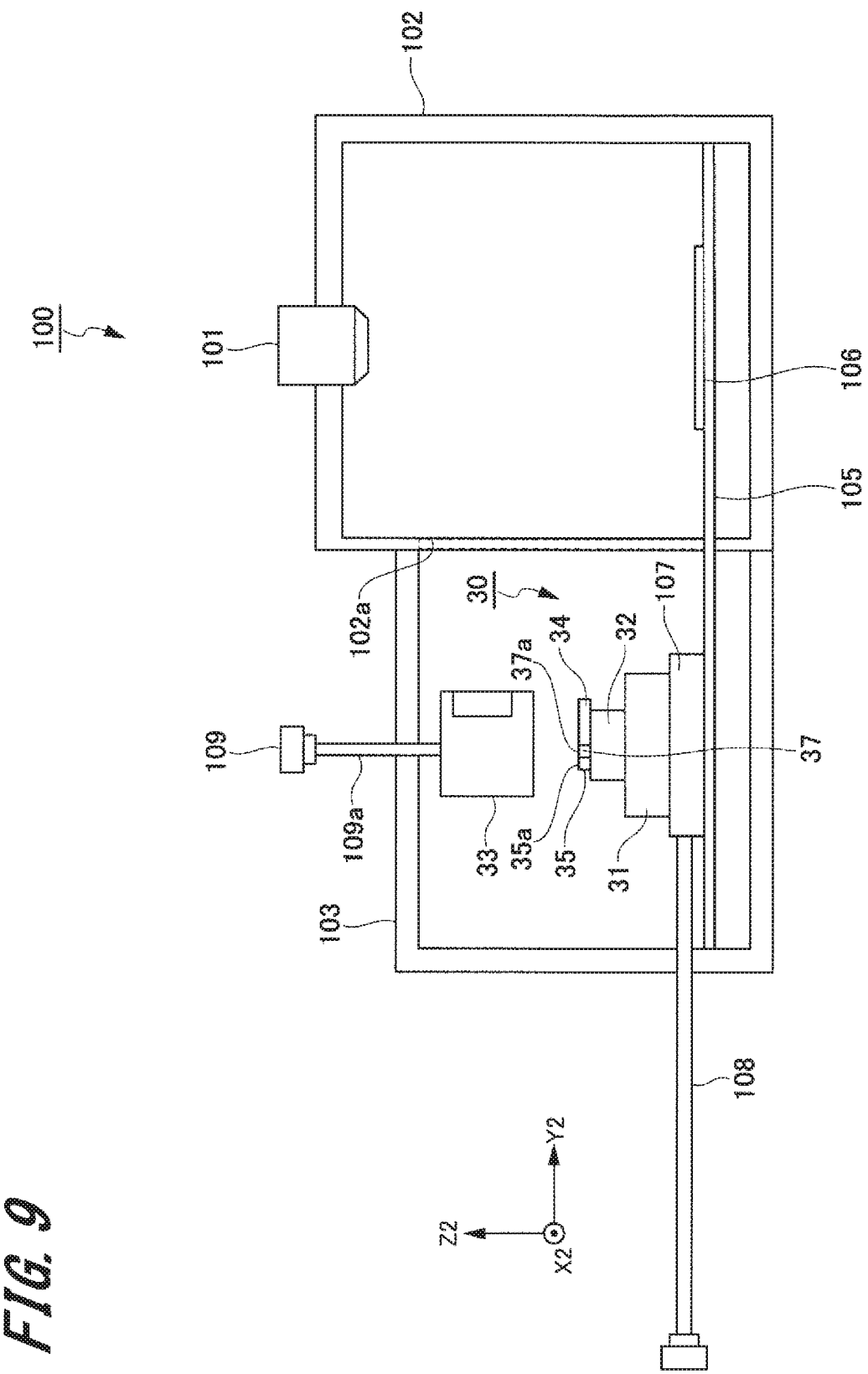
FIG. 9 is a schematic representation of the sample holder shown in FIGS. 1-3, showing the manner in which the sample holder is introduced into an electron microscope.
Figure 10:
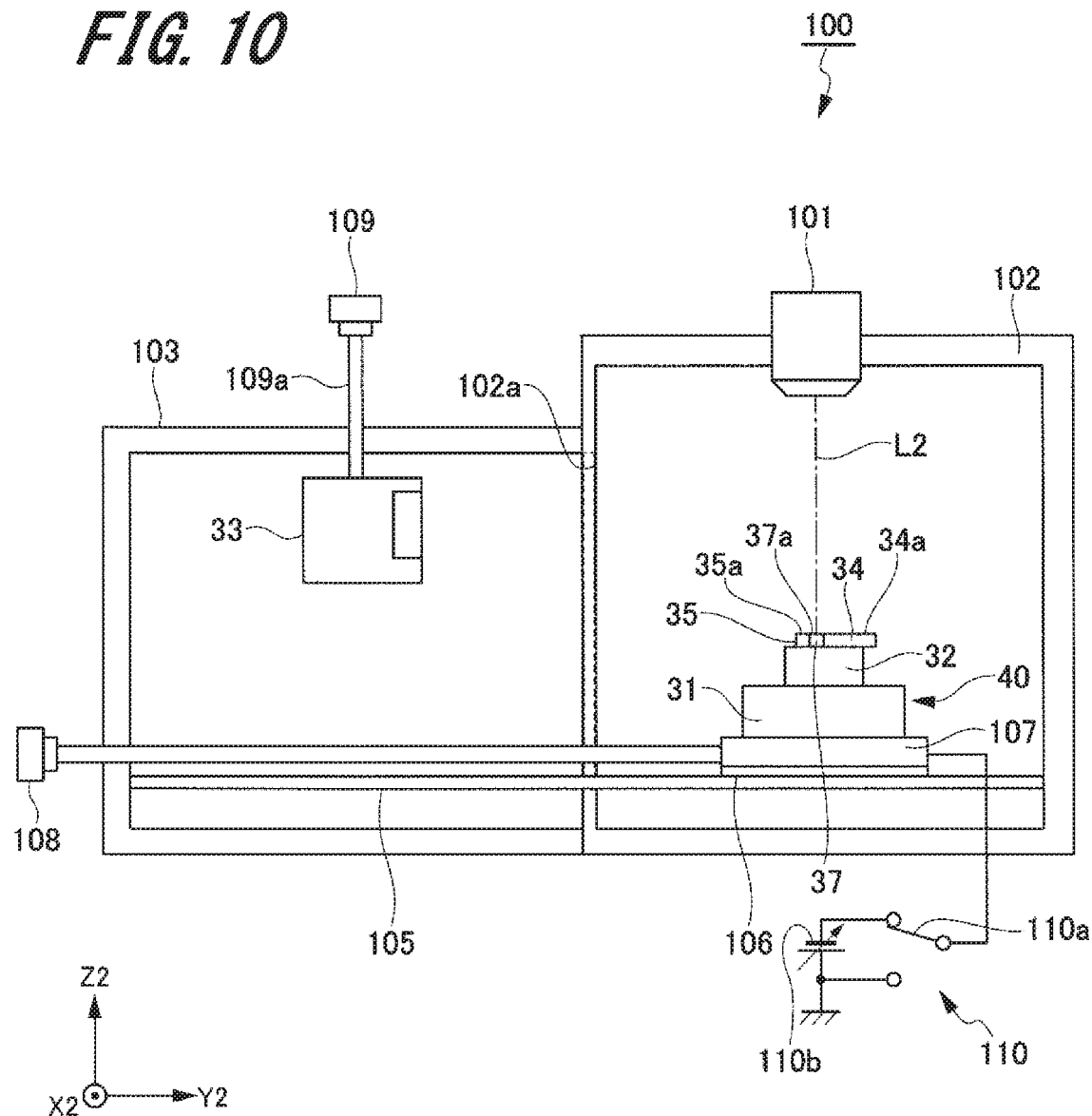
FIG. 10 is a schematic representation shown in FIG. 9, showing the manner in which the sample held on the sample holder is observed with the electron microscope.

An example of operation for observation of the fully milled sample 37 with the electron microscope 100 is next described by referring to FIGS. 9-11. First, the configuration of the electron microscope 100 is described. FIG. 9 is a schematic representation illustrating the manner in which the sample holder 30 is introduced into the electron microscope 100. FIG. 10 is a schematic representation illustrating the manner in which the sample 37 is observed with the electron microscope 100.

The electron microscope 100 shown in FIGS. 9 and 10 is a scanning electron microscope (SEM) in which an electron beam L2 is directed at the sample 37, electrons released from the sample 37 (such as secondary electrons or backscattered electrons) are detected by a detector, and a sample image derived from the detected electrons is observed. As shown in FIG. 9, the electron microscope 100 has an electron source 101, an observation chamber 102, a sample introduction chamber 103, a guide rail 105, an insulative base 106, the sample stage 107, a holder manipulating section 108, and a cover member attaching-detaching portion 109. Furthermore, as shown in FIG. 10, the electron microscope 100 has a voltage application section 110.

The observation chamber 102 is fabricated like a hollow container. The pressure inside the observation chamber 102 is pumped down to form a vacuum or substantially a vacuum by an exhaust section (not shown). One surface of the observation chamber 102 has an opening 102*a* provided with a door (not shown) that is opened and closed. A detector (not shown) is mounted in the observation chamber 102.

The electron source 101 is mounted on top of the observation chamber 102. The electron source 101 emits the electron beam L2 toward the interior space of the observation chamber 102. Assume that a fourth direction X2, a fifth direction Y2, and a sixth direction Z2 are orthogonal to each other and that the optical axis of the electron beam L2 is orthogonal both to the fourth direction X2 and to the fifth direction Y2. It is assumed that the opening 102a of the observation chamber 102 is in a plane defined by the fourth direction X2 and the sixth direction Z2.

The sample introduction chamber 103 is connected with the opening 102a of the observation chamber 102. The sample introduction chamber 103 is shaped like a hollow container. A preliminary pumpdown section (not shown) is connected with the sample introduction chamber 103. The pressure inside the sample introduction chamber 103 is so decreased by the preliminary pumpdown section that a vacuum or substantially vacuum is established.

The guide rail 105 is laid through both the inner space of the sample introduction chamber 103 and the inner space of the observation chamber 102. The guide rail 105 extends in the fifth direction Y2 from the sample introduction chamber 103 to the observation chamber 102. The sample stage 107 is slidably supported on the guide rail 105. The base portion 31 of the sample holder 30 is detachably mounted to the sample stage 107.

The insulative stage 106 is disposed on the portion of the guide rail 105 that is opposite to the electron source 101. As shown in FIG. 10, when the sample stage 107 has moved to the insulative stage 106, the sample stage 107 is connected with the voltage application section 110. The voltage application section 110 has a power supply portion 110b and a switch 110a. When the sample holder 30 has moved to the insulative stage 106, the voltage application section 110 applies a bias voltage to the sample holder 30 via the sample stage 107.

The holder manipulating section 108 and the cover member attaching-detaching portion 109 are mounted in the sample introduction chamber 103. The holder manipulating section 108 is supported to the wall surface of the sample introduction chamber 103 on the opposite side of the observation chamber 102 so as to be movable in the fifth direction Y2. The holder manipulating section 108 moves the sample stage 107 along the guide rail 105.

The cover member attaching-detaching portion 109 is disposed on top of the sample introduction chamber 103. The cover member attaching-detaching portion 109 is screwed into the connection hole 44 (FIGS. 3 and 5) of the cover member 33 and connected with the cover member 33.

1-4-2. Example of Operation for Imaging and Observation

An example of operation for imaging and observation by the use of the electron microscope 100 of the configuration described above is next described. First, as shown in FIG. 9, the sample holder 30 holding the sample 37, which has been milled, is loaded onto the sample stage 107 of the electron microscope 100. At this time, the sample holder 30 is loaded onto the sample stage 107 while the milled surface 37a of the sample 37, one surface 34a of the shield plate 34, and one surface 35a of the field-correcting plate 35 are oriented in the sixth direction Z2. The cover member 33 is mounted on the base portion 31. Therefore, when the sample 37 is transported from the ion milling apparatus 1 to the sample introduction chamber 103 of the electron microscope 100 shown in FIG. 9, the sample 37 is not exposed to the atmosphere.

Then, the air in the interior space of the sample introduction chamber 103 is evacuated using the preliminary pumpdown section to establish a vacuum or substantially a vacuum in the interior space of the sample introduction chamber 103. Then, the cover member attaching-detaching portion 109 is connected with the cover member 33. The cover member attaching-detaching section 109 is manipulated to take out the cover member 33 from the holder body 40. At this time, the interior space of the sample introduction chamber 103 is a vacuum or substantially a vacuum and so the sample 37 can be prevented from being exposed to the atmosphere.

The door (not shown) of the observation chamber 102 that can be opened and closed is then opened to place the observation chamber 102 into communication with the sample introduction chamber 103. The holder manipulating section 108 is manipulated to slide the sample stage 107 up to the insulative stage 106 of the observation chamber 102 along the guide rail 105. Consequently, the holder body 40 mounted on the sample stage 107 is brought into opposition to the electron source 101 in the sixth direction Z2.

A bias voltage is then applied to the holder body 40 by the voltage application section 110 via the sample stage 107. The electron beam L2 is directed from the electron source 101 toward the milled surface 37a of the sample 37. An image of the milled surface 37a of the sample 37 is created and observed by detecting electrons emanating from the sample 37 by means of the detector (not shown). Thus, the operation for imaging and observation of the sample 37 using the electron microscope 100 is completed.

1-4-3. State of Electric Fields Around Sample

The state of electric fields around the sample 37 assumed when the bias voltage is applied is next described by referring to FIGS. 11A and 11B, which illustrate the state of electric fields around the sample 37. FIG. 11A shows a case where the field-correcting plate 35 is not mounted. FIG. 11B shows a case where the field-correcting plate 35 is mounted.

As shown in FIG. 11A, where the field-correcting plate 35 is not present, a step is formed between the sample holding portion 32 and the end portion of the sample 37 on the opposite side of the shield plate 34. Under this condition, if a voltage is applied, the equipotential planes of the electric field G1 are parallel on one surface 34a of the shield plate 34 but disturbed from the milled surface 37a to the step. In this state, if the electron beam L2 is emitted from the electron source 101, the electron beam L2 will be bent at the locations where the equipotential planes of the electric field G1 are disturbed. As a result, the observed image is also distorted. This makes it impossible to observe the milled surface 37a of the sample 37 precisely.

On the other hand, the sample holder 30 of the present embodiment has the field-correcting plate 35 as shown in FIG. 11B. One surface 35a of the field-correcting plate 35 is positioned in the same plane as one surface 34a of the shield plate 34 and also as the milled surface 37a of the sample 37. Therefore, the one surface 34a of the shield plate 34, the milled surface 37a of the sample 37, and the one surface 35a of the field-correcting plate 35 are placed in parallel to a plane defined by the fourth direction X2 and the fifth direction Y2 and orthogonal to the sixth direction Z2. All the components of the holder body 40 are made of a nonmagnetic material, as well as the shield plate 34 and the field-correcting plate 35.

Therefore, when the voltage is applied, the equipotential planes of the electric field G1 are all parallel from the one surface 34a of the shield plate 34 to the one surface 35a of the field-correcting plate 35 through the milled surface 37a of the sample 37. That is, the electric field G1 on the milled surface 37a of the sample 37 is corrected to a parallel condition by the field-correcting plate 35 without distortion.

The electron beam L2 emitted from the electron source 101 vertically impinges on the milled surface 37a of the sample 37 without being bent by the electric field G1. Consequently, the milled surface 37a of the sample 37 can be observed precisely with the electron microscope 100.

In this way, the same sample holder 30 can be used from milling using the ion milling apparatus 1 to observation with the electron microscope 100 without transferring the sample 37 to a holding member different from the sample holder 30. In addition, the sample 37 can be transferred to the electron microscope 100 while received in the cover member 33 and admitted into the sample introduction chamber 103 and so the sample 37 can be prevented from being exposed to the atmosphere.

1-5. Example of Observation with Optical Microscope

An example in which the sample 37 is observed with an optical microscope by the use of the sample holder 30 of the configuration described above is next described by referring to FIG. 12, which is a schematic representation illustrating the manner in which the sample 37 held on the sample holder 30 is observed with the optical microscope.

Figure 12:
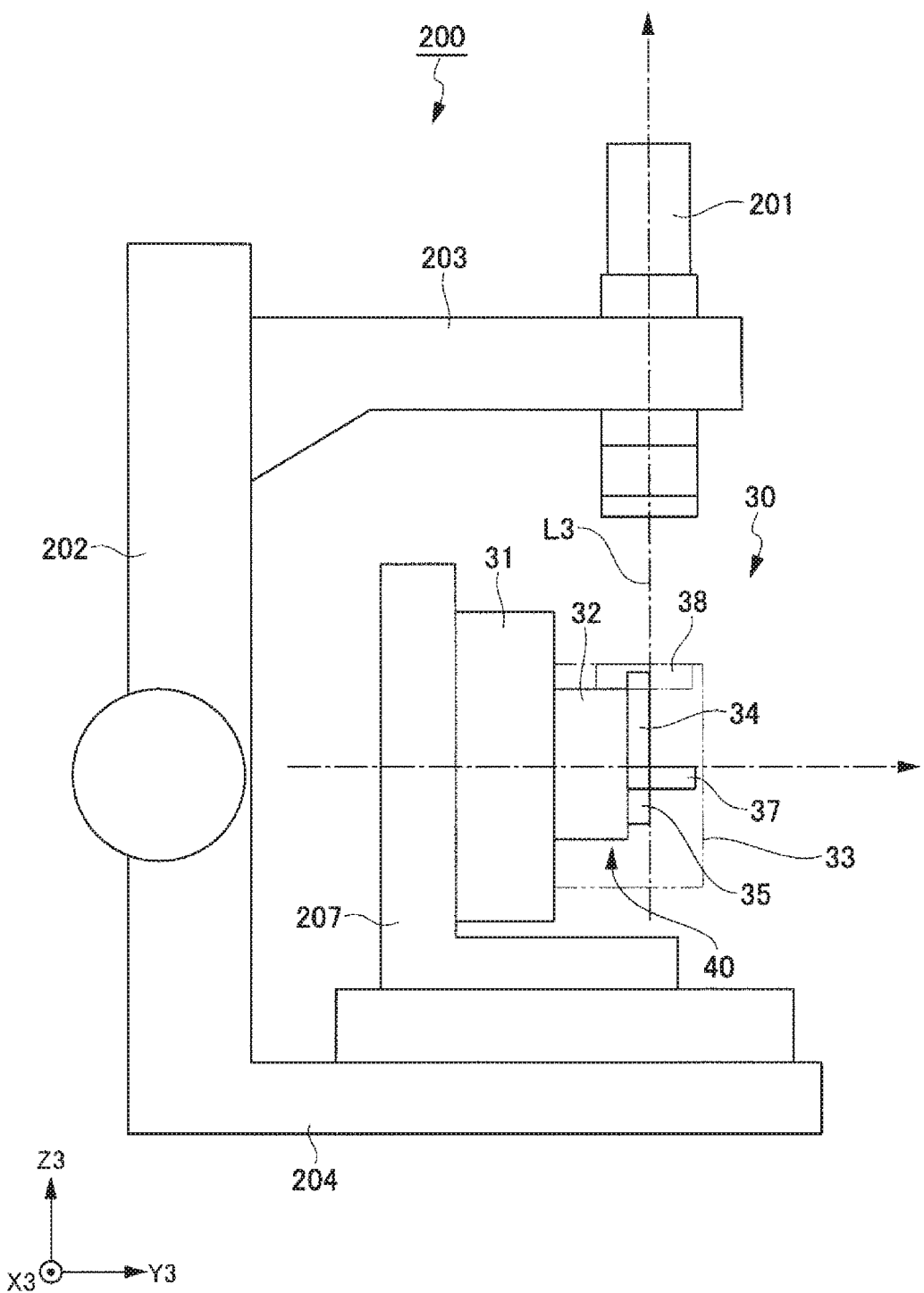
FIG. 12 is a schematic representation showing the manner in which the sample held on the sample holder associated with the first embodiment of the invention is observed with an optical microscope

As shown in FIG. 12, the optical microscope 200 has an observation portion 201, an enclosure 202, a support portion 203, a placement stage 204, and a holder stand 207. The support portion 203 is placed at the top end of the enclosure 202. The placement stage 204 is positioned at the lower end of the enclosure 202.

The observation portion 201 is mounted to the support portion 203. One example of the observation portion 201 is a lens barrel consisting of an eyepiece lens and an objective lens. The observation portion 201 has a camera for taking images of a subject under observation. The observation portion 201 is opposite to the placement stage 204.

It is assumed that directions orthogonal to the optical axis L3 of the objective lens of the observation portion 201 are a seventh direction X3 and an eighth direction Y3, respectively, and that the direction parallel to the optical axis L3 and orthogonal both to the seventh direction X3 and to the eighth direction Y3 is a ninth direction Z3.

The holder stand 207 is mounted on one surface of the placement stage 204 that is opposite to the observation portion 201. The holder stand 207 is made of a member bent into a substantially L-shaped form. The holder stand 207 has a portion standing uprightly in a parallel relation to the ninth direction Z3, and the sample holder 30 is detachably mounted to this uprightly standing portion.

When the sample holder 30 is mounted to the holder stand 207, the holder body 40 protrudes in the eighth direction Y3. The sample 37 held on the sample holding portion 32 of the holder body 40 and the observation portion 201 face one another along the optical axis L3 of the observation portion 201.

The cover member 33 of the sample holder 30 of the present embodiment is provided with the observation window 38. Therefore, the interior space of the cover member 33 can be visually checked through the observation window 38. Consequently, where the sample holder 30 is mounted on the optical microscope 200, the sample 37 can be observed with the observation section 201 without removing the cover member 33 from the base portion 31. As described previously, the amount of protrusion of the sample 37 can be adjusted using the adjusting tool 60 while the sample 37 is received in the cover member 33. Accordingly, the amount of protrusion of the sample 37 can be adjusted while making an observation with the observation section 201 without exposing the sample 37 to the atmosphere.

2. Second Embodiment

Figure 13:
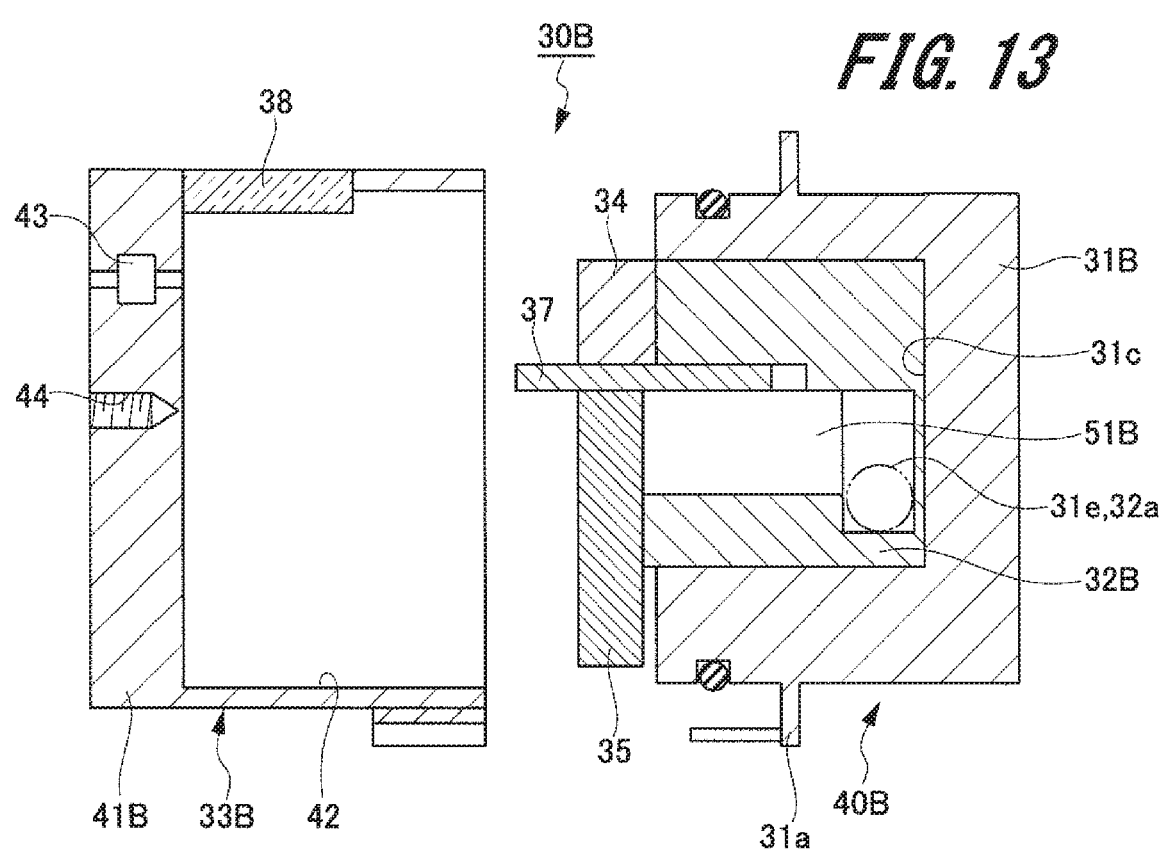
FIG. 13 is an exploded perspective view of a sample holder associated with a second embodiment of the present invention.
Figure 14:
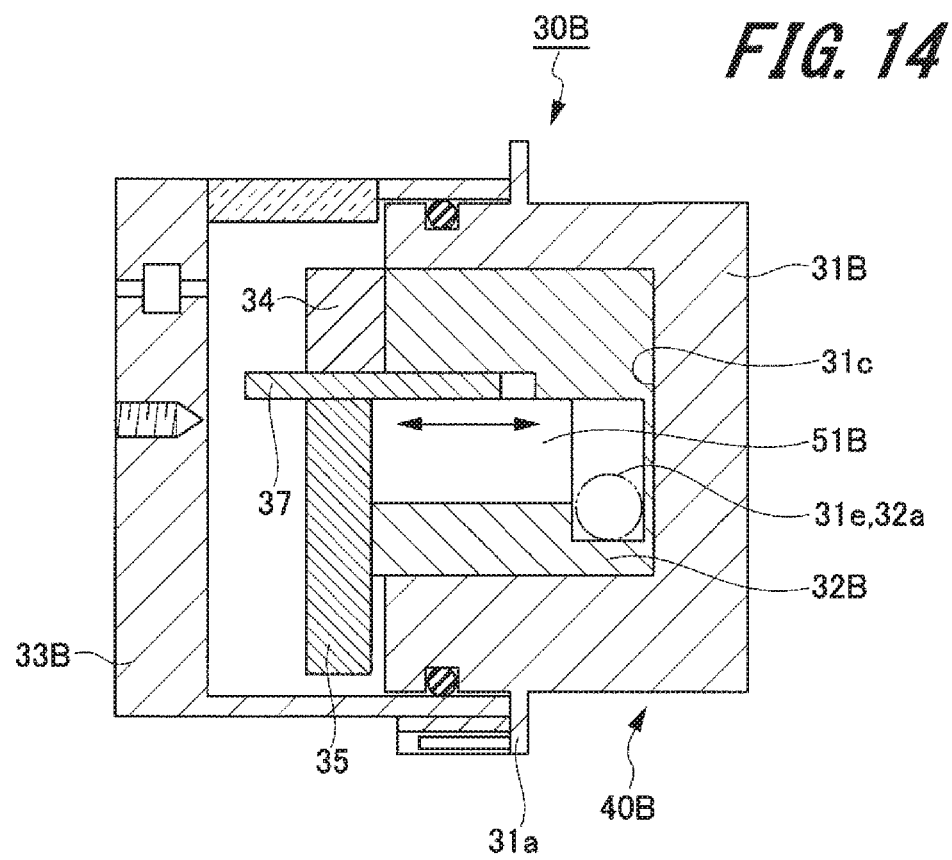
FIG. 14 is a cross-sectional view of the sample holder of FIG. 13.
Figure 15:
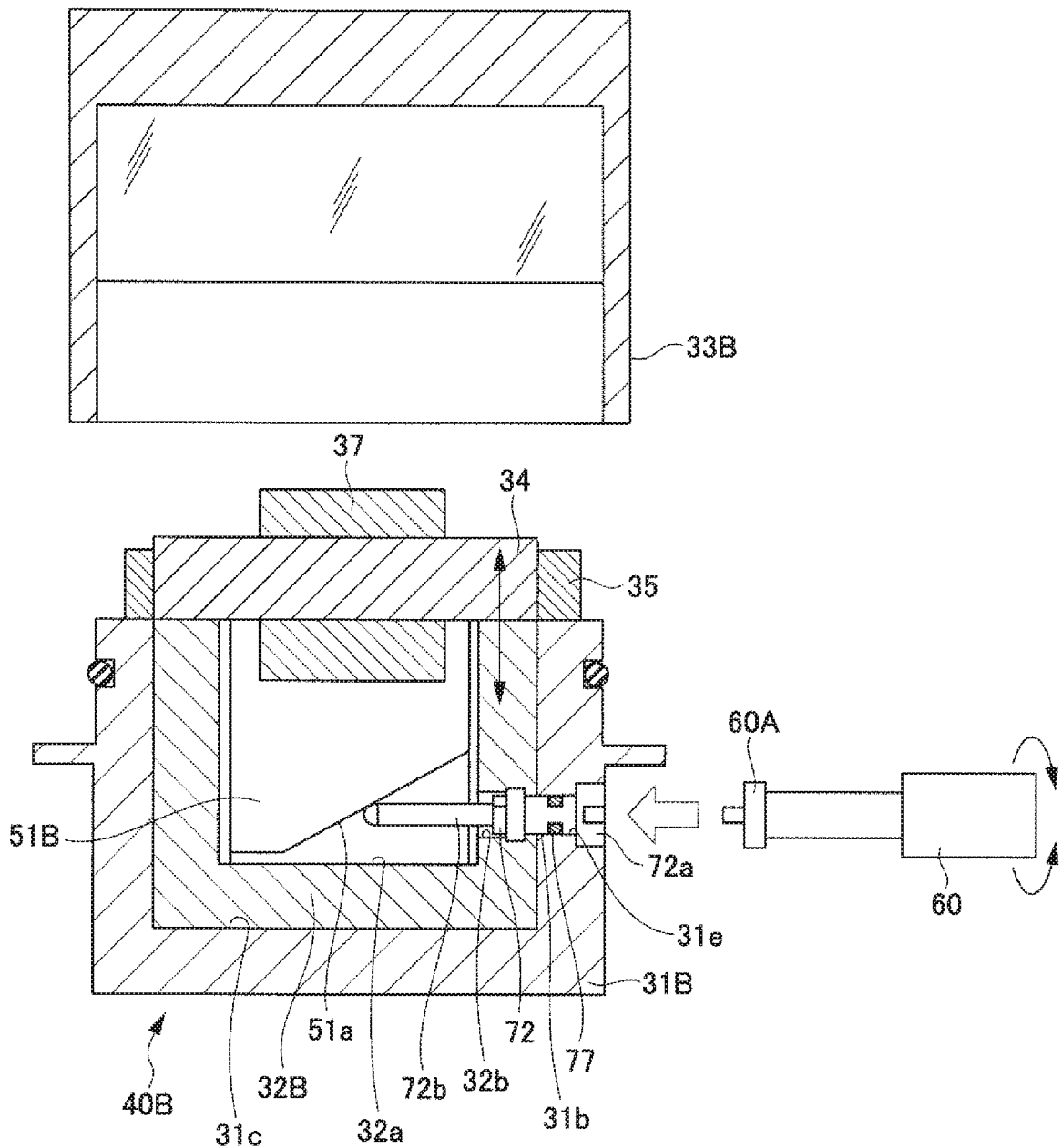
FIG. 15 is a cross-sectional view similar to FIG. 14, but in exploded form and taken from a direction different from the direction in FIG. 13.

A sample holder associated with a second embodiment is next described by referring to FIGS. 13-15, which are exploded cross sections of the sample holder.

The sample holder, 30B, associated with this second embodiment is similar to the sample holder 30 associated with the first embodiment except for the configuration of the milling position adjusting mechanism. Therefore, only the milling position adjusting mechanism is described hereinafter. Components of the sample holder 30B common to those used in the sample holder 30 associated with the first embodiment are indicated by the same reference numerals as in the above-cited figures and a repetition of the description thereof is omitted.

As shown in FIGS. 13-15, the sample holder 30B has a holder body 40B and a cover member 33B. The cover member 33B has a main surface portion 41B and a side surface portion 42. The side surface portion 42 is provided with an observation window 38. The exhaust valve 43 is mounted on the main surface portion 41B which in turn is provided with the connection hole 44. The main surface portion 41B associated with the second embodiment is not provided with the mounting hole 41a and hence the cover side connecting pin 46 is not mounted.

The holder body 40B has a base body 31B, a sample holding portion 32B for holding the sample 37, the shield plate 34, the field-correcting plate 35, and a milling position adjusting mechanism 51B. The base portion 31B is provided with the attaching portion 31c to which the sample holding portion 32B is mounted. The base portion 31B has an outer peripheral surface provided with a base side mounting hole 31e. The base side mounting hole 31e is formed at a position spaced a greater distance from the cover member 33B than the flange portion 31a. The base side mounting hole 31e is in communication with a holding portion side mounting hole 32b (described later) formed in the sample holding portion 32B.

The sample holding portion 32B has a support recess 32a in which the milling position adjusting mechanism 51B is movably supported. The holding portion side mounting hole 32b is formed in the support recess 32a and in communication with the base side mounting hole 31e. The milling position adjusting mechanism 51B has a milling position adjusting pin 72 (described later) that is mounted in the holding portion side mounting hole 32b and in the base side mounting hole 31e.

The milling position adjusting mechanism 51B is mounted in the support recess 32a of the sample holding portion 32B. A tilted surface portion 51a is formed in the end portion of the milling position adjusting mechanism 51B that is opposite to the bottom surface of the support recess 32a. The tilted surface portion 51a is opposite to the holding portion side mounting hole 32b formed in the support recess 32a and tilted toward the opening of the support recess 32a with approaching the holding portion side mounting hole 32b.

The milling position adjusting mechanism 51B has the aforementioned milling position adjusting pin 72 which is rotatably inserted in the base side mounting hole 31e and in the holding portion side mounting hole 32b. An O-ring 77 making intimate contact with the inner wall of the base side mounting hole 31e is mounted over the milling position adjusting pin 72. Consequently, when the cover member 33B is mounted to the holder body 40B, the support recess 32a is hermetically sealed.

The milling position adjusting pin 72 has a body side connecting portion 72a and an adjusting portion 72b. The adjusting portion 72b is inserted in the attaching portion 31c and abuts against the tilted surface 51a of the milling position adjusting mechanism 51B. The body side connecting portion 72a is exposed from the base side mounting hole 31e toward the outside of the base portion 31. The tool side connecting portion 60a of the adjusting tool 60 is coupled to the body side connecting portion 72a.

If the body side connecting portion 72a and the tool side connecting portion 60a are connected together and the adjusting tool 60 is rotated, the milled position adjusting pin 72 rotates to thereby move the milling position adjusting mechanism 51B out of the attaching portion 31c. Consequently, the amount of protrusion from the shield plate 34 can be adjusted while the sample 37 is hermetically sealed in the cover member 33B.

The sample holder 30B associated with the second embodiment is identical to the sample holder 30 associated with the first embodiment in other respects and thus a description of such identical components is omitted. The sample holder 30B of such configuration can yield advantageous effects similar to those produced by the sample holder 30B associated with the first embodiment.

It is to be understood that the present invention is not restricted to the embodiments described above and shown in the accompanying drawings and that the invention can be practiced in variously modified forms without departing from the gist of the present invention set forth in the appended claims.

In the above embodiments, examples have been presented in which the base portion and the sample holding portion are separate members. The present invention is not restricted to this example. For example, the base portion and the sample holding portion may be fabricated integrally.

In the present specification, words such as "parallel" and "orthogonal" are used. It is intended that they do not mean only "a strict parallel relationship" and "a strict orthogonal relationship" and that they mean "a substantially parallel relationship" and "a substantially orthogonal relationship" which contain "a parallel relationship" and "an orthogonal relationship" and which lie in ranges where intended functions can be implemented.

The invention claimed is:

1. An ion milling apparatus comprising:
an ion source for emitting an ion beam;
a sample holder on which a sample is loaded; and
a sample stage on which the sample holder is mounted;
wherein the sample holder comprises: a holder body comprising a sample holding portion for holding the sample; and a cover member detachably mounted to the holder body and hermetically sealing the sample held on the sample holding portion; and
wherein the holder body further comprises: a shield plate providing a cover over a part of the sample held on the sample holding portion and shielding the ion beam; and a field-correcting plate for correcting electric fields around the sample held on the sample holding portion,
wherein said field-correcting plate has one surface facing in a direction in which said sample protrudes from said shield plate and said shield plate has one surface facing in the direction in which the sample protrudes from the shield plate, and
wherein said one surface of the field-correcting plate and said one surface of the shield plate are coplanar.

2. An ion milling apparatus as set forth in claim 1, wherein said field-correcting plate is disposed on a downstream side of said shield plate with respect to an optical axis of said ion beam.

3. An ion milling apparatus as set forth in claim 1, wherein said field-correcting plate is provided with a cutout in which said sample held on said sample holding portion is disposed.

4. An ion milling apparatus as set forth in claim 1, wherein said holder body is made of a nonmagnetic material.

5. An ion milling apparatus as set forth in claim 1, wherein said holder body has a milling position adjusting mechanism for adjusting the position of said sample held on said sample holding portion relative to said shield plate.

6. An ion milling apparatus as set forth in claim 5, wherein said holder body has a milling position adjusting pin for manipulating said milling position adjusting mechanism, and wherein said cover member has a cover side connecting pin coupled to the milling position adjusting pin.

7. An ion milling apparatus as set forth in claim 6, wherein said field-correcting plate is provided with an insertion hole into which said cover side connecting pin can be inserted.

8. An ion milling apparatus as set forth in claim 1, wherein each of said cover member and said holder body cooperate to constitute a guide mechanism indicative of a position at which said cover member is mounted relative to said holder body.

9. An ion milling apparatus as set forth in claim 1, wherein said holder body is detachably mounted to a mounting portion different from an instrument provided with said sample stage.

10. A sample holder comprising:
a holder body having a sample holding portion for holding a sample; and
a cover member detachably mounted to the holder body and hermetically sealing the sample held on the sample holding portion;
wherein said holder body comprises: a shield plate operative to cover a part of the sample held on the sample holding portion and to shield an ion beam emitted from an ion source; and a field-correcting plate for correcting electric fields around the sample held on the sample holding portion,
wherein said field-correcting plate has one surface facing in a direction in which said sample protrudes from said shield plate and said shield plate has one surface facing in the direction in which the sample protrudes from the shield plate, and
wherein said one surface of the field-correcting plate and said one surface of the shield plate are coplanar.

* * * * *